United States Patent
Joo et al.

(10) Patent No.: US 8,791,472 B2
(45) Date of Patent: Jul. 29, 2014

(54) ARRAY SUBSTRATE, A DISPLAY PANEL HAVING THE ARRAY SUBSTRATE AND A METHOD OF MANUFACTURING THE ARRAY SUBSTRATE

(75) Inventors: Sun-Kyu Joo, Suwon-si (KR); Ho-Kyoon Kwon, Seoul (KR); Sung-Man Kim, Seoul (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 113 days.

(21) Appl. No.: 13/344,268

(22) Filed: Jan. 5, 2012

(65) Prior Publication Data
US 2012/0217514 A1    Aug. 30, 2012

(30) Foreign Application Priority Data
Feb. 25, 2011   (KR) .............. 2011-0017197

(51) Int. Cl.
*H01L 33/08*   (2010.01)
*H01L 33/36*   (2010.01)

(52) U.S. Cl.
USPC .............. 257/88; 257/E33.053; 257/E33.062; 438/34

(58) Field of Classification Search
USPC ........................................................ 257/88
See application file for complete search history.

(56) References Cited

U.S. PATENT DOCUMENTS
2006/0176434 A1* 8/2006 Kim et al. .................... 349/145

FOREIGN PATENT DOCUMENTS
| | | |
|---|---|---|
| JP | 2010-026245 | 2/2010 |
| KR | 1020010003755 | 1/2001 |
| KR | 1020020010209 | 2/2002 |

* cited by examiner

*Primary Examiner* — Zandra Smith
*Assistant Examiner* — Lawrence Tynes, Jr.
(74) *Attorney, Agent, or Firm* — F. Chau & Associates, LLC (57) ABSTRACT

A substrate includes a storage line, first and second gate lines and first and second pixel electrodes. The storage line extends along a first direction on the substrate. The first and second gate lines are substantially parallel with the storage line. The first pixel electrode is formed between the first gate line and the storage line. The second pixel electrode is formed between the second gate line and the storage line.

12 Claims, 9 Drawing Sheets

ARRAY SUBSTRATE, A DISPLAY PANEL HAVING THE ARRAY SUBSTRATE AND A METHOD OF MANUFACTURING THE ARRAY SUBSTRATE

CROSS-REFERENCE TO RELATED APPLICATION

This application claims priority under 35 U.S.C. §119 to Korean Patent Application No. 2011-17197, filed on Feb. 25, 2011, in the Korean Intellectual Property Office (KIPO), the disclosure of which is incorporated by reference herein in its entirety.

BACKGROUND

1. Technical Field

The present invention relates to an array substrate, a display panel having the array substrate and a method of manufacturing the array substrate. More particularly the present invention relates to an array substrate driven by a column inversion method, a display panel having the array substrate and a method of manufacturing the array substrate.

2. Discussion of the Related Art

Generally, a display apparatus, such as a liquid crystal display, includes a display panel and a driving part for driving the display panel. The display panel includes an array substrate, an opposite substrate and a liquid crystal layer disposed between the array substrate and the opposite substrate.

The driving part includes a data driving part for providing a data signal to a data line and a gate driving part for driving a gate line with gate voltages. The data driving part provides the data signal to the data line via a column inversion method or a dot inversion method. The column inversion method may decrease power consumption of the display apparatus compared to the dot inversion method, but may generate a vertical stripe in the display image. On the other hand, the dot inversion method may increase the power consumption of the display apparatus compared to the column inversion method, but may prevent the vertical stripe.

In addition, the opposite substrate has a plurality of spacers. The spacers include a first spacer and a second spacer. The first spacer makes contact with an upper surface of the array substrate for maintaining a cell gap of the display panel and enhancing the durability of the display panel. The second spacer faces the upper surface of the array substrate and is used for uniformly filling a liquid crystal. The opposite substrate having the first and second spacers is combined with the array substrate with the liquid crystal interposed between the array and opposite substrates to manufacture the display panel. However, an area in which the first and second spacers make contact with the upper surface of the array substrate or in which the first and second spacers are disposed may be insufficient due to a stepped portion of the upper surface of the array substrate and an aperture ratio of a pixel displaying an image. Accordingly, the first and second spacers may not function properly.

Accordingly, there is a need for display panel that maintains cell gap and consumes small power without the vertical stripe defect.

SUMMARY

Exemplary embodiments of the present invention provide an array substrate capable of decreasing power consumption and enhancing the durability of a display panel.

Exemplary embodiments of the present invention provide a display panel having the array substrate.

Exemplary embodiments of the present invention provide a method of manufacturing the array substrate.

According to an exemplary embodiment of the present invention, a substrate includes a storage line, first and second gate lines, and first and second pixel electrodes. The storage line extends along a first direction on the substrate. The first and second gate lines are substantially parallel with the storage line. The first pixel electrode is formed between the first gate line and the storage line. The second pixel electrode is formed between the second gate line and the storage line.

In an exemplary embodiment of the present invention, the storage line may include a storage part formed between the first and second pixel electrodes.

In an exemplary embodiment of the present invention, the storage part may partially overlap at least one of the first and second pixel electrodes.

In an exemplary embodiment of the present invention, the substrate may further include first and second data lines and first and second switching elements. The first data line may extend along a second direction crossing the first direction. The second data line may be substantially parallel with the first data line, the first and second data lines may be spaced apart from each other, and the first and second pixel electrodes may be disposed between the first and second data lines. The first switching element may be electrically connected to the first pixel electrode, and may include a first source electrode diverging from the first data line. The second switching element may be electrically connected to the second pixel electrode, and may include a second source electrode diverging from the second data line.

In an exemplary embodiment of the present invention, the first data line may provide, to the first pixel electrode, a data signal having a first polarity during a first frame, and the second data line may provide, to the second pixel electrode, a data signal having a second polarity during a second frame.

In an exemplary embodiment of the present invention, the substrate may further include first and second compensating data electrodes and first and second compensating gate electrodes. The first compensating data electrode may extend from a first drain electrode of the first switching element, wherein the first drain electrode is spaced apart from the first source electrode. The first compensating gate electrode may diverge from the first gate line, wherein the first compensating gate electrode is formed under the first compensating data electrode. The second compensating data electrode may extend from a second drain electrode of the second switching element, wherein the second drain electrode is spaced apart from the second source electrode. The second compensating gate electrode may diverge from the second gate line, wherein the second compensating gate electrode is formed under the second compensating data electrode.

In an exemplary embodiment of the present invention, the substrate may further include a third gate line substantially parallel with the storage line and adjacent to the first gate line and a fourth gate line substantially parallel with the storage line and adjacent to the second gate line, wherein a first gap may be disposed between the first and third gate lines and between the first and second data lines, and a second gap may be disposed between the second and fourth gate lines and between the first and second data lines.

In an exemplary embodiment of the present invention, the substrate may further include first and second storage electrodes. The first storage electrode may extend from the storage line to the first pixel electrode and partially overlap the first pixel electrode; and the second storage electrode may extend from the storage line to the second pixel electrode and partially overlap the second pixel electrode.

According to an exemplary embodiment of the present invention, a display panel includes a first substrate and a second substrate. The first substrate includes a storage line, first and second gate lines, third and fourth gate lines, a first pixel electrode and a second pixel electrode. The storage line extends along a first direction on the first substrate. The first and second gate lines are substantially parallel with the storage line, and are adjacent to each other. The third and fourth gate lines are substantially parallel with the storage line, and are adjacent to each other. The first pixel electrode is formed between the second gate line and the storage line. The second pixel electrode is formed between the third gate line and the storage line. The second substrate faces the first substrate.

In an exemplary embodiment of the present invention, the storage line may include a storage part formed between the first and second pixel electrodes.

In an exemplary embodiment of the present invention, the second substrate may include a first spacer overlapping the storage part.

In an exemplary embodiment of the present invention, the display panel may include a protection layer formed on the storage part. The first and second pixel electrodes may be spaced apart from each other on the protection layer, and may partially overlap the storage part.

In an exemplary embodiment of the present invention, the first spacer may make contact with the first and second pixel electrodes and the protection layer exposed through the first and second pixel electrodes.

In an exemplary embodiment of the present invention, the first substrate may include first and second data lines and first and second switching elements. The first data line may extend along a second direction crossing the first direction. The second data line may be substantially parallel with the first data line and may be spaced apart from the first data line, and the first and second pixel electrodes may be disposed between the first and second data lines. The first switching element may be electrically connected to the first pixel electrode, and may include a first source electrode diverging from the first data line. The second switching element may be electrically connected to the second pixel electrode, and may include a second source electrode diverging from the second data line.

In an exemplary embodiment of the present invention, a first gap may be disposed between the first and second gate lines and between the first and second date lines. A second gap may be disposed between the third and fourth gate lines and between the first and second data lines. The second substrate may overlap at least one of the first and second gaps, and may include a second spacer facing the first substrate.

In an exemplary embodiment of the present invention, the first substrate may further comprise a protection layer formed on the storage part. The second spacer may be spaced apart from the protection layer.

In an exemplary embodiment of the present invention, the first data line may provide, to the first pixel electrode, a data signal having a first polarity during a first frame, and the second data line may provide, to the second pixel electrode, a data signal having a second polarity opposite to the first polarity during a second frame.

According to an exemplary embodiment of the present invention, there is provided a method of manufacturing an array substrate. In the method, a gate metal layer is formed on a base substrate. The gate metal layer is patterned to form a storage line, first and second gate lines and third and fourth gate lines. The storage line extends along a first direction. The first and second gate lines are substantially parallel with the storage line, and are adjacent to each other. The third and fourth gate lines are substantially parallel with the storage line, and are adjacent to each other. A transparent electrode layer is formed on the base substrate on which the storage line and the first, second, third and fourth gate lines are formed. The transparent electrode layer is patterned to form a first pixel electrode between the second gate line and the storage line and a second pixel electrode between the third gate line and the storage line.

In an exemplary embodiment of the present invention, the storage line includes a storage part disposed between the first and second pixel electrodes, and at least one of the first and second pixel electrodes partially overlaps the storage part.

In an exemplary embodiment of the present invention, a data metal layer may be formed on the base substrate on which the storage line and first to fourth gate lines are formed prior to forming the transparent electrode layer. The data metal layer may be patterned to form a first data line, a second data line, a first source electrode and a second source electrode. The first data line may extend along a second direction crossing the first direction. The second data line may be substantially parallel with the first data line and spaced apart from the first data line, and the first and second pixel electrodes may be disposed between the first and second data lines. The first source electrode may diverge from the first data line and may provide a data signal having a first polarity to the first pixel electrode. The second source electrode may diverge from the second data line and may provide a data signal having a second polarity to the second pixel electrode.

In an exemplary embodiment of the present invention, a first gap may be disposed between the first and second gate lines and between the first and second data lines; and a second gap may be disposed between the third and fourth gate lines and between the first and second data lines.

In an exemplary embodiment of the present invention, patterning the gate metal layer to form the storage line and the first to fourth gate lines may include: forming a first storage electrode extending from the storage line to the first pixel electrode to partially overlap the first pixel electrode, and forming a second storage electrode extending from the storage line to the second pixel electrode to partially overlap the second pixel electrode.

According to an exemplary embodiment of the present invention, includes a storage line disposed between first and second gate lines; a protection layer disposed over the storage line; a first pixel electrode adjacent to the first gate line and overlapping the storage line and the protection layer; and a second pixel electrode adjacent to the second gate line and overlapping the storage line and the protection layer, wherein a portion of the protection layer disposed over the storage line is exposed between the first and second pixel electrodes to permit contact between a surface of the exposed portion of the protection layer and a surface of a first overlying spacer.

The substrate may further include a third gate line adjacent to the first gate line, wherein a gap is formed between the first and third gate lines, the gap being large enough to accommodate a second overlying spacer.

The substrate may further include a third pixel electrode adjacent to the third gate line, wherein the first to third pixel electrodes are disposed in the same column and the third and second pixel electrodes receive a first polarity data signal during a frame and the first pixel electrode receives a second polarity data signal during the frame.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENTS

Hereinafter, exemplary embodiments of the present invention will be explained in detail with reference to the accompanying drawings.

Figure 1:
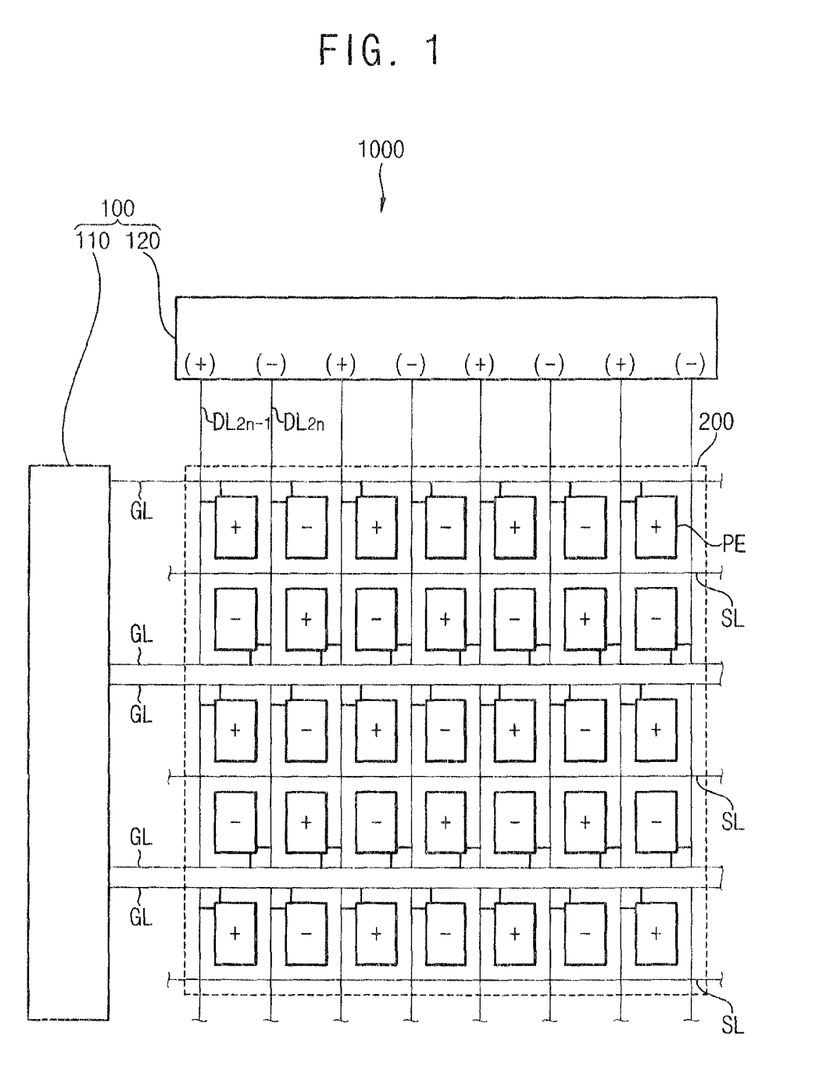
FIG. 1 is a plan view illustrating a display apparatus including a display panel according to an exemplary embodiment of the present invention.

FIG. 1 is a plan view illustrating a display apparatus 1000 including a display panel 200 according to an exemplary embodiment of the present invention.

Referring to FIG. 1, the display apparatus 1000 includes a driving part 100 and the display panel 200.

The driving part 100 includes a gate driving part 110 and a data driving part 120. The gate driving part 110 sequentially provides gate signals to gate lines GL of the display panel 200.

The data driving part 120 provides data signals to data lines DL of the display panel 200. For example, the data driving part 120 alternately provides a positive polarity data signal and a negative polarity data signal to each of the data lines DL. The data driving part 120 provides the positive polarity data signal to a (2n−1)-th data line DL2n−1, and the negative polarity data signal to a (2n)-th data line DL2n, during a (2m−1)-th frame. Then, the data driving part 120 provides the negative polarity data signal to the (2n−1)-th data line DL2n−1, and the positive polarity data signal to the (2n)-th data line DL2n, during a (2m)-th frame. The data driving part 110 provides the data signals having different polarities to the data lines DL during two consecutive frames to drive the data lines DL via the column inversion method. The data driving part 110 may drive the data lines DL using other driving schemes, such as the dot inversion method, for example.

Figure 2:
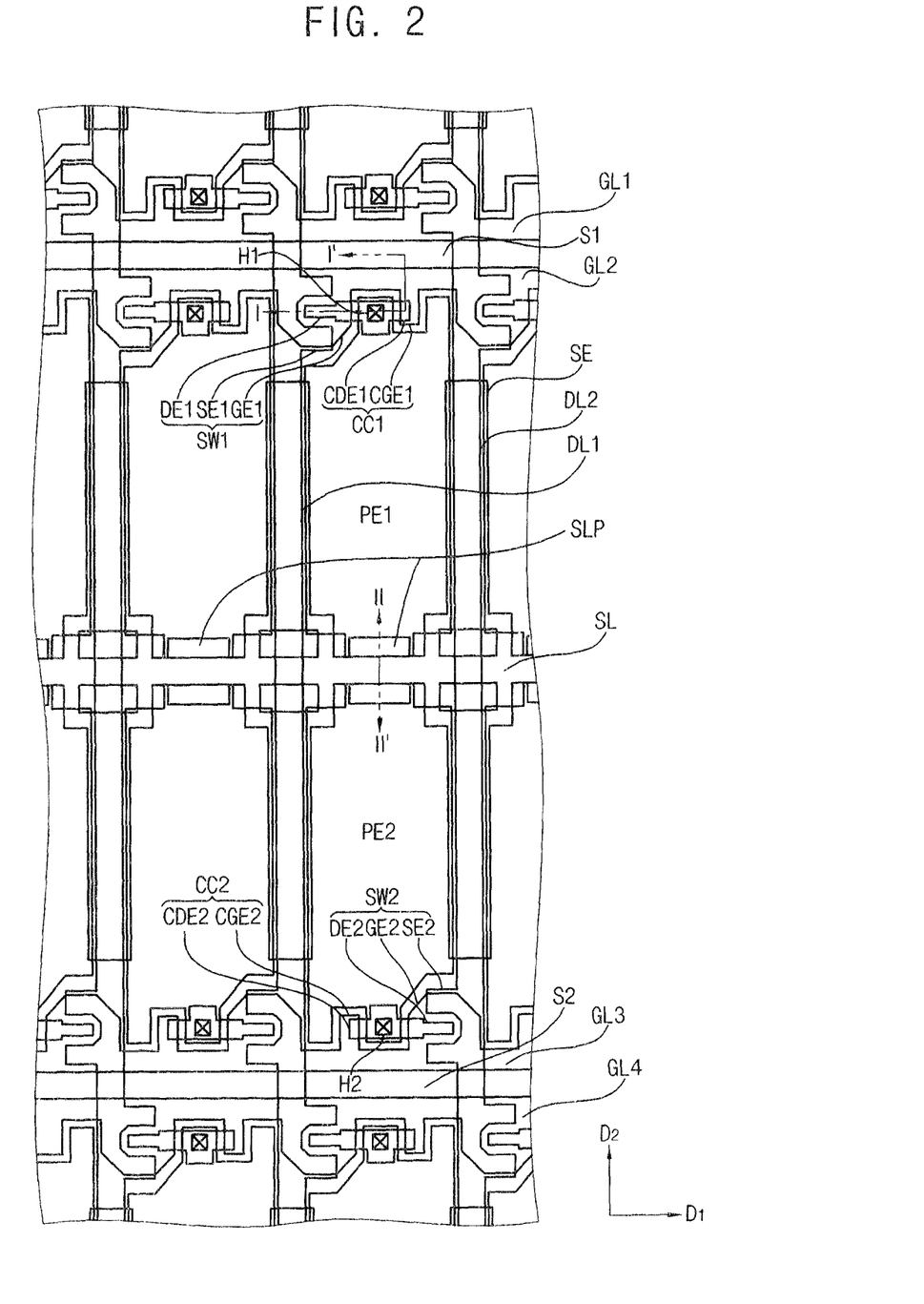
FIG. 2 is a plan view illustrating an array substrate of the display apparatus of FIG. 1, according to an exemplary embodiment of the present invention.
Figure 3:
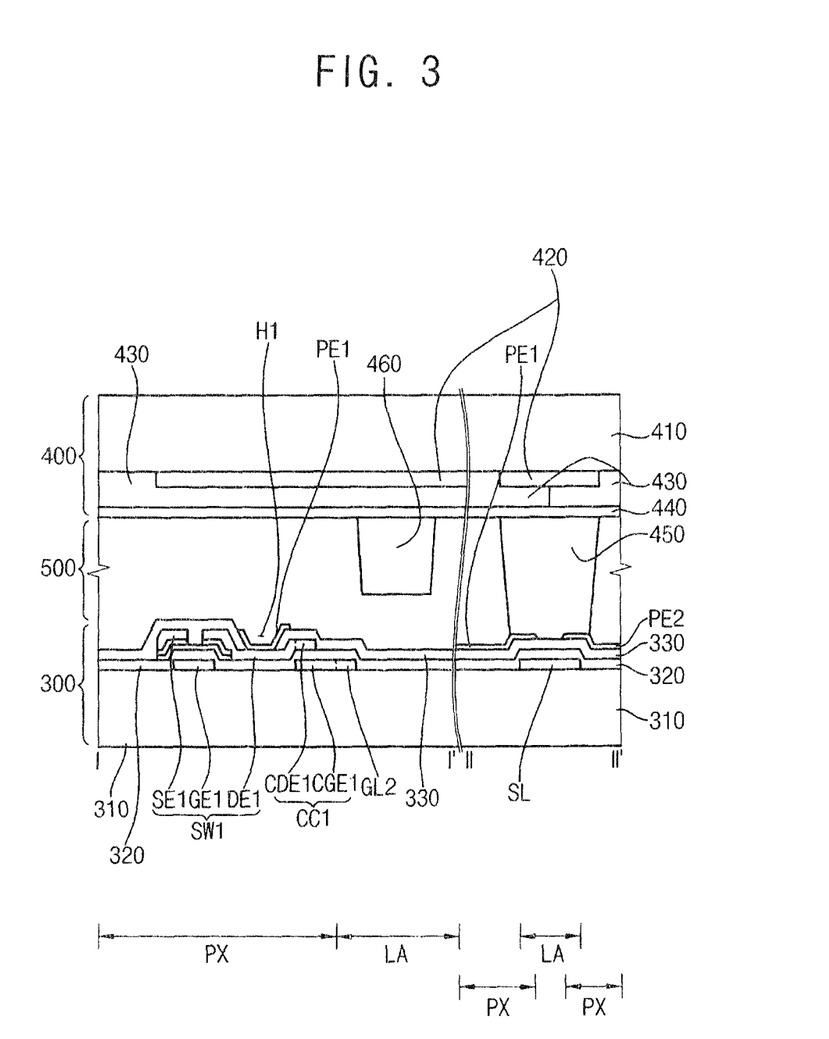
FIG. 3 is a cross-sectional view taken along line I-I' and line II-II' of the array substrate in FIG. 2 with an opposite substrate placed thereupon forming the display panel of FIG. 1.

FIG. 2 is a plan view illustrating an array substrate of the display apparatus 1000, according to an exemplary embodiment of the present invention. FIG. 3 is a cross-sectional view taken along line I-I' and line II-II' of the array substrate in FIG. 2 with an opposite substrate placed thereupon forming the display panel 200 of FIG. 1.

Referring to FIGS. 2 and 3, the display panel 200 includes an array substrate 300, an opposite substrate 400 and a liquid crystal layer 500.

The array substrate 300 includes a first base substrate 310, first, second, third and fourth gate lines GL1, GL2, GL3 and GL4, a storage line SL, a storage electrode SE, a gate insulating layer 320, first and second data lines DL1 and DL2, first and second pixel electrodes PE1 and PE2, first and second switching elements SW1 and SW2, first and second compensating gate electrodes CGE1 and CGE2, first and second compensating data electrodes CDE1 and CDE2, and a protection layer 330.

The first base substrate 310 is divided into a display area for displaying images and a peripheral area surrounding the display area. The display area of the first base substrate 310 may be divided into a pixel area PX in which the pixel electrodes PE1 and PE2 are disposed, and a line area LA surrounding the pixel area PX.

The first to fourth gate lines GL1, GL2, GL3 and GL4 extend along a first direction D1 in the line area LA. The first and second gate lines GL1 and GL2 are adjacent to each other. The first and second gate lines GL1 and GL2 are spaced apart from the storage line SL along a second direction D2 crossing the first direction D1, and are substantially parallel with the storage line SL. The third and fourth gate lines GL3 and GL4 are adjacent to each other. The third and fourth gate lines GL3 and GL4 are spaced apart from the storage line SL along a direction opposite to the second direction D2, and are substantially parallel with the storage line SL.

A first space (e.g., gap) S1 is disposed between the first and second gate lines GL1 and GL2 and between the first and second data lines DL1 and DL2, and a second space (e.g., gap) S2 is disposed between the third and fourth gate lines GL3 and GL4 and between the first and second data lines DL1 and DL2. The first and second data lines DL1 and DL2 are adjacent to each other. At least one of the first and second spaces S1 and S2 overlaps a second spacer 460 of the opposite substrate 400.

The storage line SL is formed between the first and second gate lines GL1 and GL2 and the third and fourth gate lines GL3 and GL4. The adjacent pairs of gate lines and the storage lines SL are alternately formed. For example, the gate lines GL1 and GL2, the storage line SL, the third and fourth gate lines GL3 and GL4, and another storage line SL are formed, in order.

The gate insulting layer 320 and the protection layer 330 are sequentially formed on the storage line SL. The storage line SL includes a storage part SLP disposed between the first and second data lines DL1 and DL2 along the first direction D1. The storage part SLP is disposed between the first and second data lines DL1 and DL2, and does not overlap the first and second data lines DL1 and DL2, and thus a stepped portion is not formed over the storage line SL due to the first and second data lines DL1 and DL2. In other words, no protrusion is formed over the storage line SL by a data line, since no data lines are formed on the storage line SL.

The storage part SLP is further disposed along the second direction D2 between the first and second pixel electrodes PE1 and PE2 and on the protection layer 330, and thus may partially overlap the first and second pixel electrodes PE1 and PE2. In this case, storage capacitances may be thrilled at portions where the storage part SLP and each of the first and second pixel electrodes PE1 and PE2 overlap each other. Accordingly, a first spacer 450 of the opposite substrate 400 overlaps parts of the first and second pixel electrodes PE1 and PE2 which partially overlap the storage part SLP, and the first spacer 450 overlaps the protection layer 330 exposed through the first and second pixel electrodes PE1 and PE2. The first spacer 450 may also overlap parts of the first and second pixel electrodes PE1 and PE2 that do not overlap the storage part SLP. For example, the first spacer 450 may overlap parts of the first and second pixel electrodes PE1 and PE2 that are adjacent to the storage part SLP.

Each of the storage parts SLP forms the storage capacitances with each of the first and second pixel electrodes PE1 and PE2, and thus a total area of the storage line SL in the first base substrate 310 is decreased so that an aperture ratio of the pixel area PX may be maintained.

In an area where each of the first and second pixel electrodes PE1 and PE2 partially overlaps the storage part SLP, a thickness of each of the first and second pixel electrodes PE1 and PE2 is about 450 Å. Thus, a stepped portion formed between the first and second pixel electrodes PE1 and PE2 and the protection layer 330 may be negligible due to a pressure provided from the opposite substrate 400 to the array substrate 300 when the array substrate 300 and the opposite substrate 400 are combined with each other. Accordingly, most of an upper surface of the first spacer 450 makes contact with the first and second pixel electrodes PE1 and PE2 overlapping with the storage line SL and makes contact with the protection layer 330, and thus the durability of the display panel 200 may be enhanced. To enable more of the upper surface of the first spacer 450 to make contact with the protection layer 330 between the first and second pixel electrodes PE1 and PE2, the exposed portion of the protection layer 330 may be widened.

Thus, the first and second electrodes PE1 and PE2 and the storage line SL form the storage capacitor, and provide an area in which the first spacer 450 makes contact with an upper surface of the storage line SL, at the same time. Most of the first surface of the first spacer 450 makes contact with the upper surface of the storage line SL which is relatively flat, so that a cell gap between the array substrate 300 and the opposite substrate 400 may be uniformly maintained and thus the durability of the display panel 200 may be enhanced.

Alternatively, the storage part SLP may be disposed between the first and second pixel electrodes PE1 and PE2, but the storage part SLP may not overlap the first and second pixel electrodes PE1 and PE2. Further, the storage part SLP may be configured to overlap one, but not the other, of the first and second pixel electrodes PE1 and PE2.

Further, the storage part SLP may have various kinds of shapes such as a quadrilateral shape, a pentagonal shape, a circular shape, an oval shape, and so on in a plane view.

The storage electrodes SE extend from the storage line SL along the second direction D2 and the direction opposite to the second direction D2, and may partially overlap the first pixel electrode PE1 and the second electrode PE2. Accordingly, the storage electrode SE and each of the first and second pixel electrodes PE1 and PE2 may form the storage capacitance.

The storage electrodes SE may overlap the first and second data lines DL1 and DL2 as illustrated in FIG. 2. Alternatively, the storage electrode SE overlapping the first and second data lines DL1 and DL2 may be removed, and the storage electrode SE overlapping the first and second pixel electrodes PE1 and PE2 may remain. Further, one of the storage electrodes SE may overlap one of the first and second data lines DL1 and DL2, while the other may not, and one of the storage electrodes SE may overlap one of the first and second pixel electrodes PE1 and PE2, while the other may not.

The first pixel electrode PE1 is disposed between the first and second gate lines GL1 and GL2, specifically the second gate line GL2, and the storage line SL, and the second pixel electrode PE2 is disposed between the storage line SL and the third and fourth gate lines GL3 and GL4, specifically the third gate line GL3. The first pixel electrode PE1 is driven by the first switching element SW1 electrically connected to the second gate line GL2 disposed closer to the storage line SL than the first gate line GL1, and the second pixel electrode PE2 is driven by the second switching element SW2 electrically connected to the third gate line GL3 disposed closer to the storage line SL than the fourth gate line GL4. To effectuate functionality with other data driving schemes, the second switching element SW2 may be disposed in connection with the same data line DL1 as the first switching element SW1.

The first and second data lines DL1 and DL2 extend along the second direction D2 in the line area LA. The first and second pixel electrodes PE1 and PE2 are disposed between the first and second data lines DL1 and DL2.

The first pixel electrode PE1 may receive the positive polarity (+) data signal from the first switching element SW1 electrically connected to the first data line DL1 during the (2m−1)-th frame. The second pixel electrode PE2 may receive the negative polarity (−) data signal from the second switching element SW2 electrically connected to the second data line DL2 during the (2m)-th frame.

In addition, the first pixel electrode PE1 may receive the negative polarity (−) data signal from the first switching element SW1 electrically connected to the first data line DL1 during the (2m)-th frame. The second pixel electrode PE2 may receive the positive polarity (+) data signal from the second switching element SW2 electrically connected to the second data line DL2 during the (2m)-th frame. For example, the first and second pixel electrodes PE1 and PE2 receive the data signals having the different polarities from different data lines during each frame. Accordingly, each of the first and second data lines DL1 and DL2 may be driven by the column inversion driving method of the data driving part 120, so that one polarity is provided to the pixel electrodes connected to the first data line DL1 and another polarity is provided to the pixel electrode connected to the second data line DL2, during one frame, and in a next frame the polarities are inverted. However, each of the first and second data lines DL1 and DL2 is alternately connected to the pixel electrodes disposed in different rows, and thus the display panel 200 may display substantially the same image as a display panel driven by the dot inversion driving method.

For example, the first data line DL1 does not sequentially provide the data signal to the first and second pixel electrodes PE1 and PE2 respectively disposed in first and second rows and in the same column, but repeatedly provides the data signal to the first pixel electrode PE1 disposed in the first row and in a first column and to the second pixel electrode PE2 disposed in the second row and in a second column adjacent to the first column, which means that the first data line DL1 provides the data signal in a zigzag pattern, so that power consumption of the display apparatus 1000 may be decreased and a vertical stripe may not be recognized in an image displayed on the display panel 200.

The first switching element SW1 includes a first gate electrode GE1 diverging from the second gate line GL2, a first source electrode SE1 diverging from the first data line DL1, and a first drain electrode DE1 spaced apart from the first source electrode SE1. The second switching element SW2 includes a second gate electrode GE2 diverging from the third gate line GL3, a second source electrode diverging from the second data line DL2, and a second drain electrode DE2 spaced apart from the second source electrode SE2.

The first compensating gate electrode CGE1 diverges from the second gate line GL2, and is spaced apart from the first gate electrode GE1. The second compensating gate electrode CGE2 diverges from the third gate line GL3, and is spaced apart from the second gate electrode GE2.

The first compensating data electrode CDE1 extends from the first drain electrode DE1, and overlaps the first compensating gate electrode CGE1, to form a first compensating capacitor CC1. The second compensating data electrode CDE2 extends from the second drain electrode DE2, and overlaps the second compensating gate electrode CGE2, to form a second compensating capacitor CC2. Accordingly, the first and second compensating capacitors CC1 and CC2 may compensate for each of the parasitic capacitances formed between the first and second gate electrodes GE1 and GE2 and the first and second source electrodes SE1 and SE2, when a gate pattern having the first to fourth gate lines GL1, GL2, GL3 and GL4, and a data pattern having the first and second data lines DL1 and DL2 are misaligned with each other. The capacitances of the first and second compensating capacitors CC1 and CC2 may be adjusted by varying the amount of overlap or the separation space between the compensating data electrodes and the compensating gate electrodes.

The opposite substrate 400 includes a second base substrate 410, a light blocking part 420, a color filter layer 430, a common electrode 440, the first spacer 450 and the second spacer 460.

The light blocking part 420 is disposed on the second base substrate 410. The light blocking part 420 is disposed along the line area LA surrounding the pixel area PX, so that the light blocking part 420 may prevent light from leaking out between the pixel areas PX. The light blocking part 420 may partially overlap with the pixel area PX.

The color filter layer 430 is formed on the second base substrate 410 on which the light blocking part 420 is formed. The color filter layer 430 may include red, green and blue color filters.

The common electrode 440 is formed on the color filter layer 430, and faces the first and second pixel electrodes PE1 and PE2. The common electrode 440 together with the first and second pixel electrodes PE1 and PE2 and the liquid crystal layer 500 forms a liquid crystal capacitor. The opposite substrate 400 may further include a planarization layer (not shown) disposed between the color filter layer 430 and the common electrode 440.

The first and second spacers 450 and 460 may be disposed in the line area LA. However, the first and second spacers 450 and 460 may contact parts of the pixel area PX. For example, the first spacer 450 is disposed in the line area LA in which the storage line SL is disposed. A length of the first spacer 450 is larger than that of the second spacer 460 so that the upper surface of the first spacer 450 makes contact with the upper surface of the array substrate 300 when the array substrate 300 and the opposite substrate 400 are combined with each other. Accordingly, the first spacer 450 may uniformly maintain the cell gap between the array substrate 300 and the opposite substrate 400.

The upper surface of the first spacer 450 may make contact with the first and second pixel electrodes PE1 and PE2 and the protection layer 330 exposed through the first and second pixel electrodes PE1 and PE2, as illustrated in FIG. 3. The impact of the stepped portion between the first and second pixel electrodes PE1 and PE2 and the protection layer 330 exposed through the first and second pixel electrodes PE1 and PE2 may be negligible due to a temperature or a pressure provided to the display panel 200 in the manufacturing of the display panel 200. Accordingly, most of the upper surface of the first spacer 450 makes contact with the upper surface of the storage line SL which is relatively flat due to the thinness of the portions of the first and second pixel electrodes PE1 and PE2 overlapping the storage line SL, and thus the durability of the display panel 200 may be enhanced.

An upper surface of the second spacer 460 faces one of the line area LA in which the first and second gate lines GL1 and GL2 are disposed, and the line area LA in which the third and fourth gate lines GL3 and GL4 are disposed. For example, the upper surface of the second spacer 460 may face the first and second gate lines GL1 and GL2 in the first space S1, or may face the third and fourth gate lines GL3 in GL4 and the second space S2. The upper surface of the second spacer 460 may also face both the line area LA in which the first and second gate lines GL1 and GL2 are disposed, and the line area LA in which the third and fourth gate lines GL3 and GL4 are disposed.

A stepped portion is not formed by the data pattern, which includes the first and second data lines DL1 and DL2, in the line area LA where the first to fourth gate lines GL1, GL2, GL3 and GK4 are formed, so that the second spacer 460 may not make contact with the data pattern such as the data lines even though the substrates of the display panel 200 may be contracted by an external environment such as the pressure or the temperature. In addition, the line area LA in which the first to fourth gate lines GL1 to GL4 are disposed has a sufficient distance from the first and second pixel electrodes PE1 and PE2, and thus the aperture ratio of the display panel 200 is not affected by the line area LA. This distance may be modified to change the aperture ratio.

The second spacer 460 enables a liquid crystal of the liquid crystal layer 500 to be uniformly filled in the display panel 200. The number of the second spacers 460 is more than that of the first spacers 450. However, the number of the second spacers 460 may be less than or equal to that of the first spacers 450.

The first and second spacers 450 and 460 may have a column shape. The first and second spacers 450 and 460 may have a tapered shape from the opposite substrate 400 to the array substrate 300. Other shapes of the first and second spacers 450 and 460 are contemplated as well.

Figure 4A:
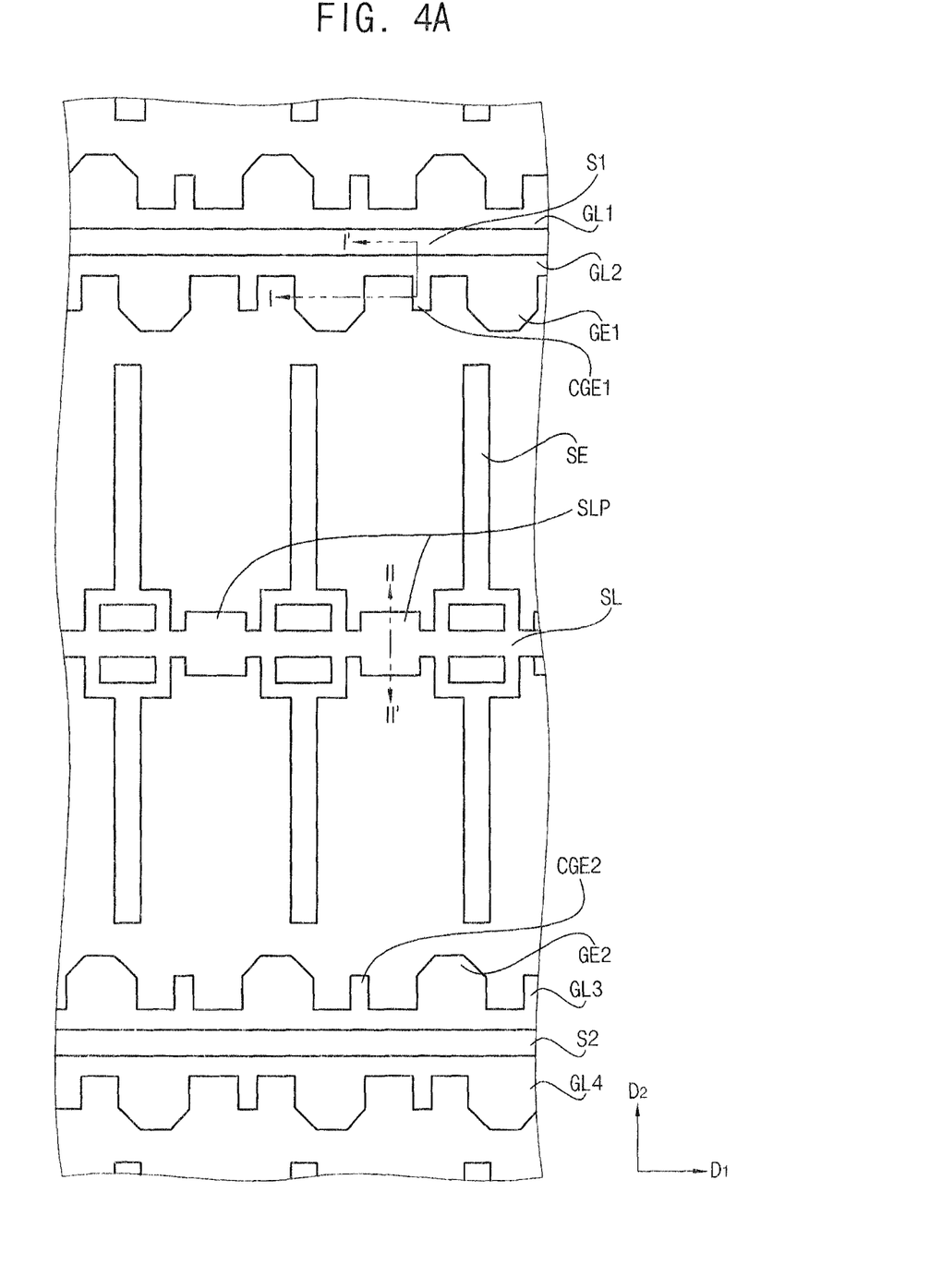
FIGS. 4A, 5A and 6A are plan views illustrating a method of manufacturing the array substrate of FIG. 2, according to an exemplary embodiment of the present invention.
Figure 4B:
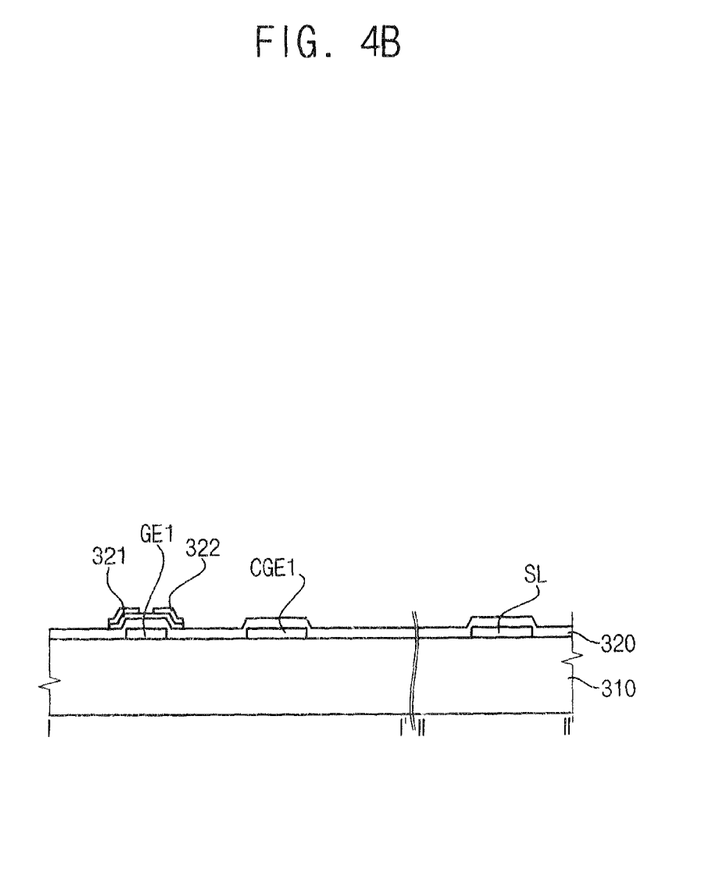
FIGS. 4B, 5B and 6B are cross-sectional views corresponding to FIGS. 4A, 5A and 6A, respectively.
Figure 5A:
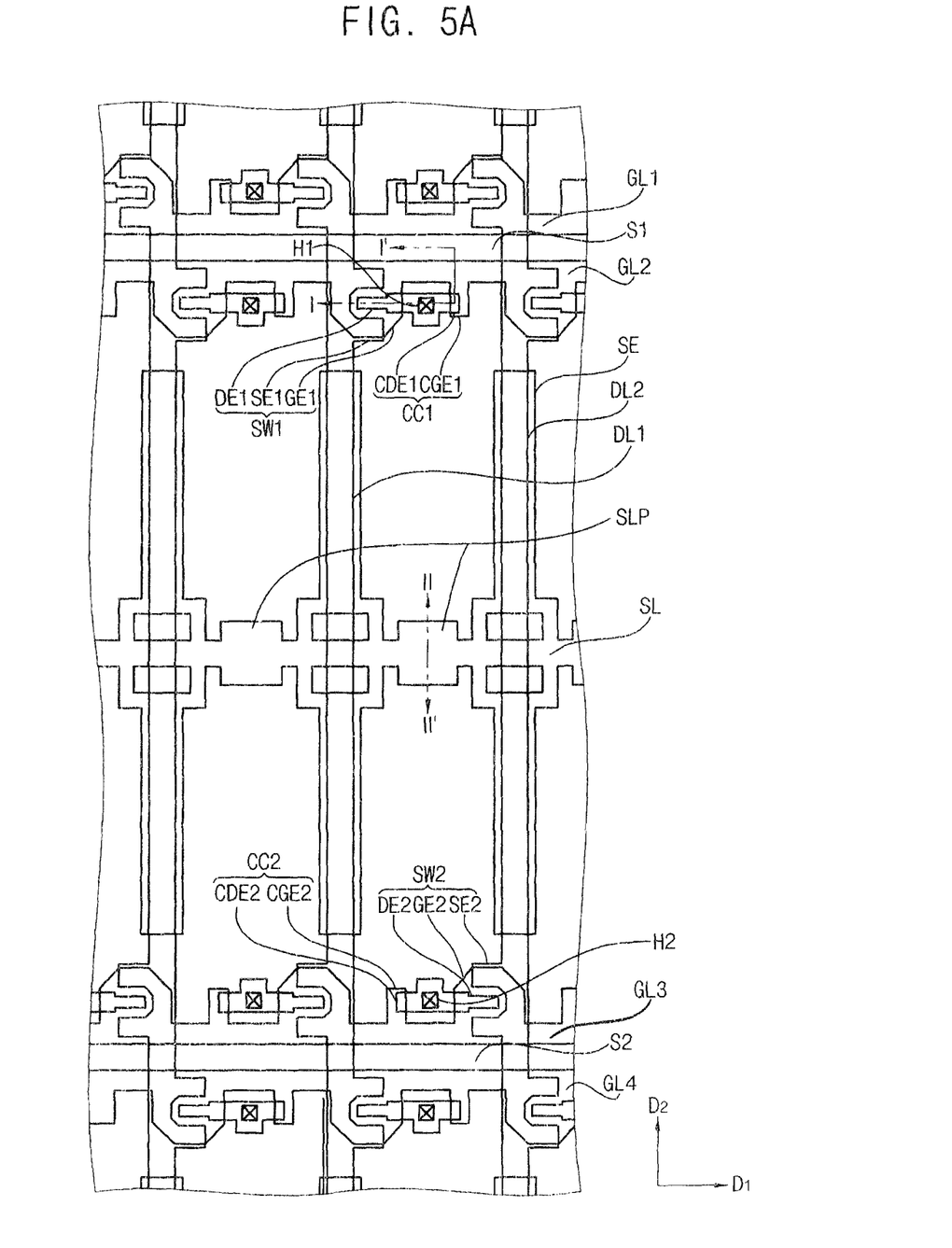
Figure 5B:
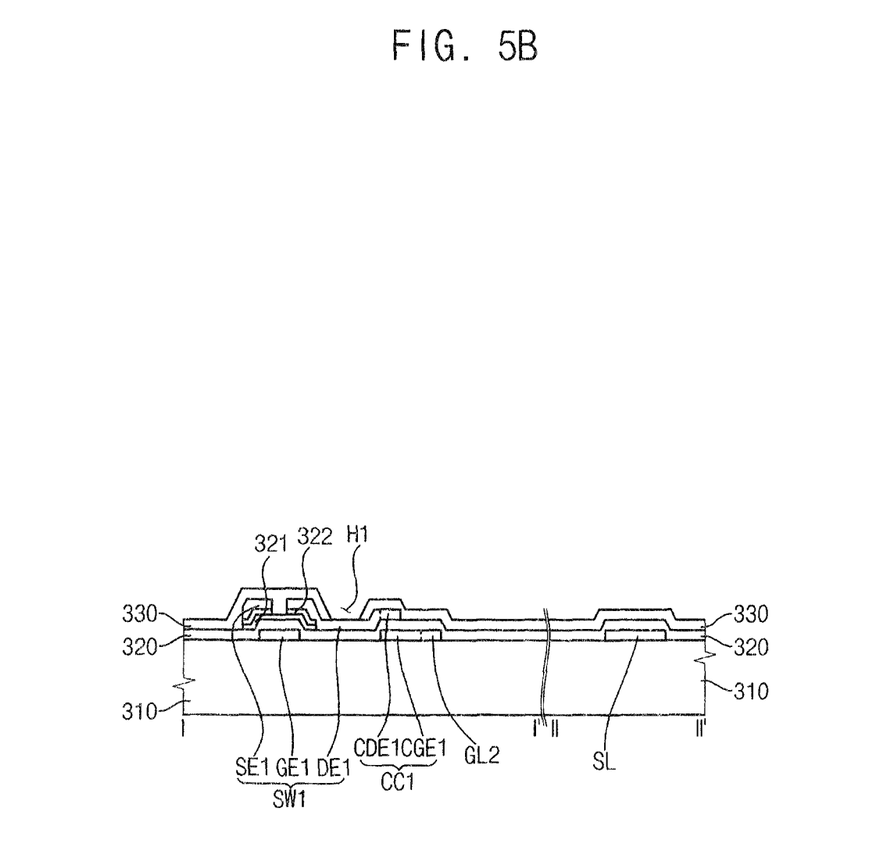
Figure 6A:
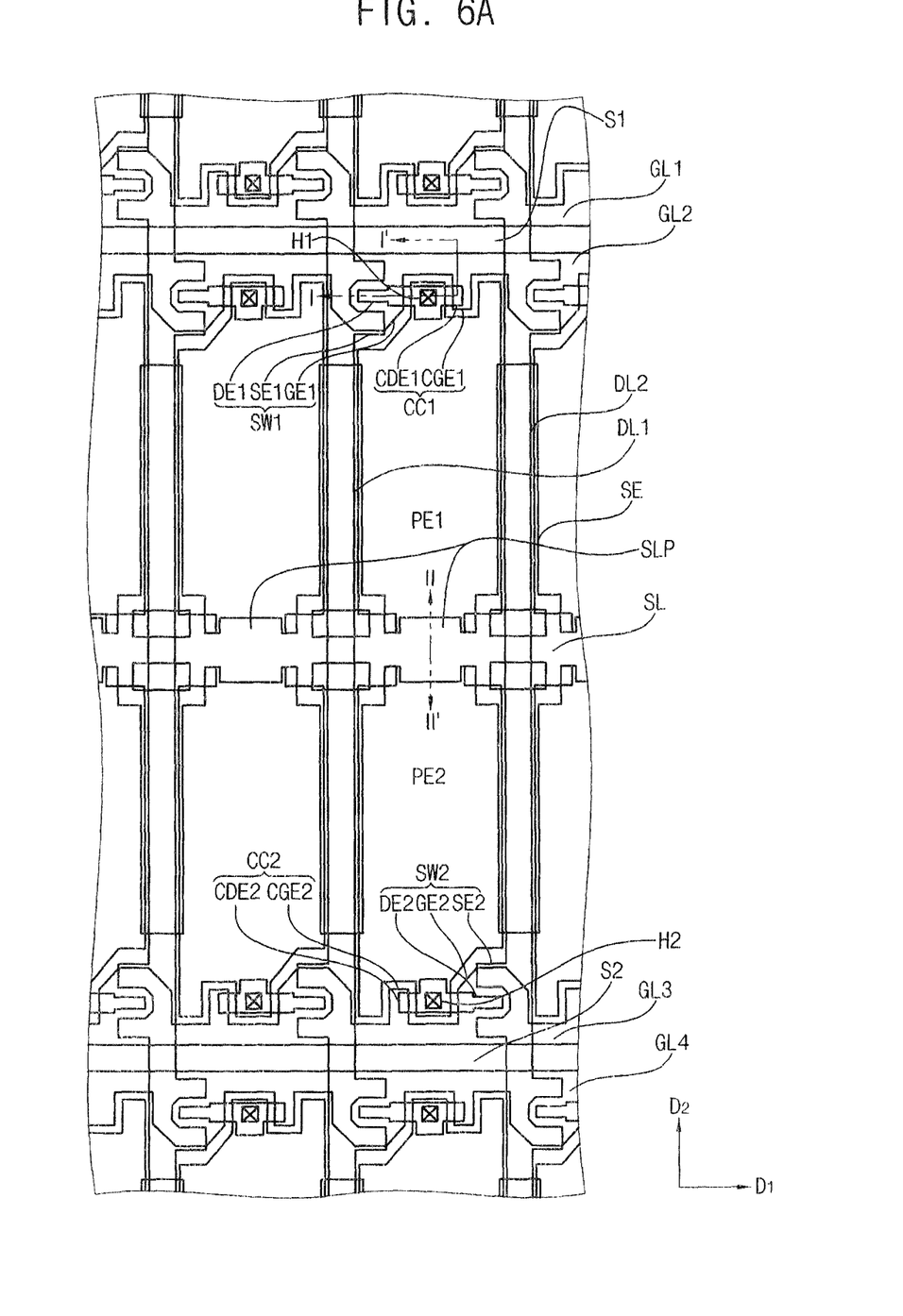
Figure 6B:
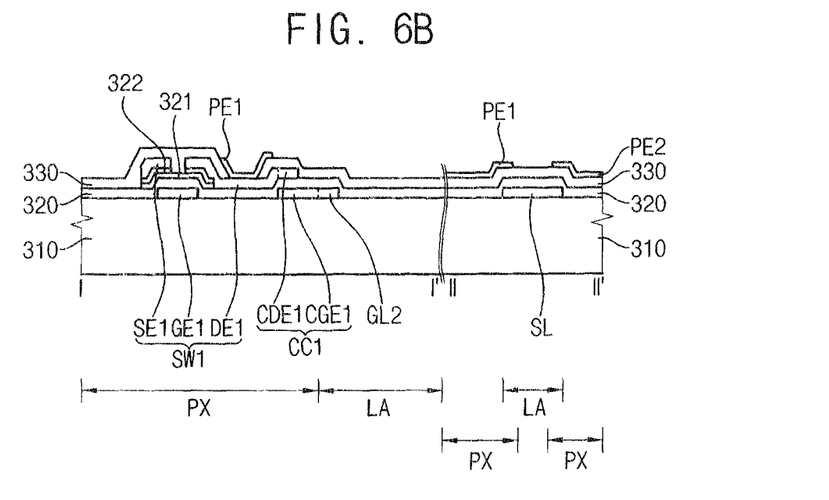

FIGS. 4A, 5A and 6A are plan views illustrating a method of manufacturing the array substrate 300 of the display panel 200, according to an exemplary embodiment of the present invention. FIGS. 4B, 5B and 6B are cross-sectional views corresponding to FIGS. 4A, 5A and 6A, respectively.

Referring to FIGS. 4A and 4B, a gate metal layer is deposited on the first base substrate 310. The gate metal layer may have copper (Cu), aluminum (Al), molybdenum (Mo), or an alloy thereof. A photoresist layer is deposited on the first base substrate 310 on which the gate metal layer is formed. A mask having a transmissive portion and a blocking portion is disposed over the first base substrate 310 on which the photoresist layer is formed, and the gate metal layer is patterned to form a gate pattern.

The gate pattern includes the first and second gate lines GL1 and GL2, the storage line SL, the storage electrode SE, the first and second gate electrodes GE1 and GE2, and the first and second compensating gate electrodes CGE1 and CGE2. The first and second gate lines GL1 and GL2 extend along the first direction D1, and are adjacent to each other. The storage line SL has the storage part SLP partially overlapping the first and second pixel electrodes PE1 and PE2, wherein edges of the first and second pixel electrodes PE1 and PE2 are substantially parallel with and spaced apart from the first and second gate lines GL1 and GL2 and the first and second pixel electrodes PE1 and PE2 are adjacent to each other along the second direction D2 crossing the first direction D1. The storage electrode SE diverges from the storage line SL. The first and second gate electrodes GE1 and GE2 respectively diverge from the second and third gate lines GL2 and GL3. The first and second compensating gate electrodes CGE1 and CGE2 are respectively spaced apart from the first and second gate electrodes GE1 and GE2. The first and second gate lines GL1 and GL2 adjacent to each other and the first and second data lines DL1 and DL2 explained below define the first space S1.

The gate pattern further includes the third and fourth gate lines GL3 and GL4. The third and fourth gate lines GL3 and GL4 extend along the first direction D1, and are adjacent to each other. Edges of the first and second pixel electrodes PE1 and PE2 are substantially parallel with and spaced apart from the third and fourth gate lines GL3 and GL4. The third and fourth gate lines GL3 and GL4 and the first and second data lines DL1 and DL2 define the second space S2.

A gate insulating layer 320, a semiconductor layer 321 and an ohmic contact layer 322 are sequentially deposited on the first base substrate 310 on which the gate pattern is formed. Then, the semiconductor layer 321 and the ohmic contact layer 322 are patterned. The gate insulating layer 320 electrically insulates the gate pattern from a data pattern explained below.

Referring to FIGS. 5A and 5B, a data metal layer is deposited on the first base substrate 310 on which the semiconductor layer 321 and the ohmic contact layer 322 are formed. The data metal layer may have copper (Cu), aluminum (Al), molybdenum (Mo), or an alloy thereof. A photoresist layer is deposited on the first base substrate 310 on which the data metal layer is formed. A mask having a transmissive portion and a blocking portion is disposed over the first base substrate 310 on which the photoresist layer is formed, and the data metal layer is patterned to form the data pattern.

The data pattern includes the first and second data lines DL1 and DL2, the first and second source electrodes SE1 and SE2, the first and second drain electrodes DE1 and DE2, and the first and second compensating data electrodes CDE1 and CDE2. The first and second data lines DL1 and DL2 extend along the second direction D2. The first and second source electrodes SE1 and SE2 respectively diverge from the first and second data lines DL1 and DL2. The first and second drain electrodes DE1 and DE2 are respectively spaced apart from the first and second source electrodes SE1 and SE2. The first and second compensating data electrodes CDE1 and CDE2 extend from the first and second drain electrodes DE1 and DE2 to the first and second compensating gate electrodes CGE1 and CGE2, and form the first and second compensating capacitors CC1 and CC2 with the first and second compensating gate electrodes CGE1 and CGE2, respectively. A protection layer 330 is then deposited on the first base substrate 310 on which the data pattern is formed. A mask having a transmissive portion and a blocking portion is disposed over the first base substrate 310 on which the protection layer 330 is formed, and the protection layer 330 is patterned to form first and second contact holes H1 and H2 respectively exposing the first and second drain electrodes DE1 and DE2.

Referring to FIGS. 6A and 6B, a transparent electrode layer is deposited on the protection layer 330 through which the first and second contact holes H1 and H2 are formed. A photoresist layer is deposited on the first base substrate 310 on which the first and second contact holes H1 and H2 are formed. A mask having a transmissive portion and a blocking portion is disposed over the first base substrate 310 on which the photoresist layer is formed. Light is irradiated onto the first base substrate 310 over which the mask is disposed, and the transparent electrode layer is patterned to form the first and second pixel electrodes PE1 and PE2. The first and second pixel electrodes PE1 and PE2 are electrically connected to the first drain electrode DE1 and the second drain electrode DE2 through the first and second contact holes H1 and H2, respectively, and partially overlap the storage line SL and the storage electrode SE. Accordingly, the manufacture of the array substrate 300 having the first base substrate 310 on which the gate pattern, the gate insulating layer 320, the data pattern, the protection layer 330 and the first and second pixel electrodes PE1 and PE2 are formed is substantially completed.

Figure 6C:
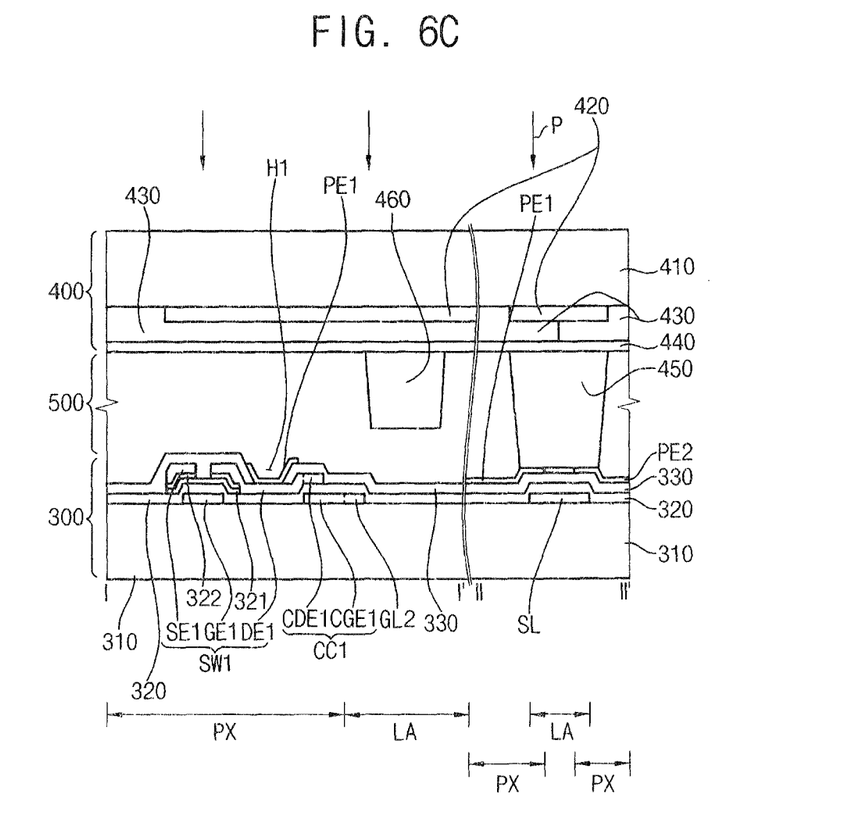
FIG. 6C is a cross-sectional view illustrating a method of manufacturing the display panel of FIG. 3.

Referring to FIG. 6C, the array substrate 300 is combined with the opposite substrate 400 on which the first spacer 450 corresponding to the storage line SL and the second spacer 460 corresponding to the first and second gate lines GL1 and GL2 and the first separate space S1 are formed, by using an adhesive or a sealing member. The liquid crystal is disposed between the array substrate 300 and the opposite substrate 400 to form the liquid crystal layer 500. A pressure P is applied to the opposite substrate 400 in a direction to the array substrate 300 to fix the array substrate 300 to the opposite substrate 400 and to remove any unfilled areas of the liquid crystal layer 500. Accordingly, the first surface of the first spacer 450 makes contact with the upper surface of the array substrate 300 corresponding to the storage line SL, and the second spacer 460 faces the first and second gate lines GL1 and GL2 in the first space S1, and thus the manufacture of the display panel 200 is substantially completed.

Alternatively, the adhesive or the sealing member is formed in the peripheral area of the array substrate 300, and the liquid crystal is dropped in between the adhesive or the sealing member to form the liquid crystal layer 500. Then, the array substrate 300 on which the liquid crystal layer 500 is formed is combined with the opposite substrate 400 on which the first spacer 450 corresponding to the storage line SL and the second spacer 460 corresponding to the first and second gate lines GL1 and GL2 and the first space S1 are formed. The pressure P is applied to the opposite substrate 400 in a direction to the array substrate 300 to fix the array substrate 300 to the opposite substrate 400 and to remove any unfilled areas of the liquid crystal layer 500. Accordingly, the first surface of the first spacer 450 makes contact with the upper surface of the array substrate 300 corresponding to the storage line SL, and thus the manufacture of the display panel 200 is substantially completed.

Accordingly to the present exemplary embodiment, the data driving part 120 of the display apparatus 1000 is driven by the column inversion driving method, and the first and second pixel electrodes PE1 and PE2 adjacent to each other along the second direction D2 receive the data signals having polarities different to each other, so that the power consumption of the display apparatus 1000 may be decreased and vertical stripes may be prevented from being recognized in an image displayed on the display panel 200.

In addition, most of the first surface of the first spacer 450 of the opposite substrate 400 makes contact with the upper surface of the array substrate 300 corresponding to the storage line SL, so that the durability of the display panel 200 may be enhanced.

According to exemplary embodiments of the present invention, a data driving part may be driven by the column inversion method, so that power consumption of a display apparatus employing the data driving part may be decreased.

In addition, adjacent data lines may provide data signals having polarities different from each other to pixel electrodes adjacent to each other along the vertical direction, so that the vertical stripe defect may be prevented.

In addition, a storage line may only be disposed along the horizontal direction and between pixel electrodes adjacent to each other along the vertical direction, so that the area in which a first spacer of an opposite substrate makes contact with an upper surface of an array substrate corresponding to the storage line may be increased. Accordingly, the durability of the display panel may be enhanced.

In addition, a second spacer of the opposite substrate is disposed between adjacent gate lines and is disposed to correspond to a gap between the adjacent gate lines, so that the second spacer is prevented from making contact with the array substrate according to external influences. Accordingly, an unfilled area of the liquid crystal may be prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A substrate, comprising:
a storage line extending along a first direction on the substrate;
first and second gate lines substantially parallel with the storage line;
a first pixel electrode formed between the first gate line and the storage line; and
a second pixel electrode formed between the second gate line and the storage line,
wherein the storage line is disposed between the first and second gate lines, the substrate further comprising:
a third gate line disposed adjacent to the first gate line and on the same side of the storage line as the first gate line;
a fourth gate line disposed adjacent to the second gate line and on the same side of the storage line as the second gate line; and
a protection layer disposed on the storage line,
wherein a portion of the protection layer disposed on the storage line is exposed between the first and second pixel electrodes.

2. The substrate of claim 1, wherein the storage line comprises a storage part formed between the first and second pixel electrodes.

3. The substrate of claim 2, wherein the storage part partially overlaps at least one of the first and second pixel electrodes.

4. The substrate of claim 1, further comprising:
a first data line extending along a second direction crossing the first direction;
a second data line substantially parallel with the first data line, and spaced apart from the first data line, wherein the first and second pixel electrodes are disposed between the first and second data lines;
a first switching element electrically connected to the first pixel electrode, and having a first source electrode diverging from the first data line; and
a second switching element electrically connected to the second pixel electrode, and having a second source electrode diverging from the second data line.

5. The substrate of claim 4, wherein the first data line provides, to the first pixel electrode, a data signal having a first polarity during a first frame, and the second data line provides, to the second pixel electrode, a data signal having a second polarity opposite to the first polarity during a second frame.

6. The substrate of claim 4, further comprising:
a first compensating data electrode extending from a first drain electrode of the first switching element, wherein the first drain electrode is spaced apart from the first source electrode;
a first compensating gate electrode diverging from the first gate line, and formed under the first compensating data electrode;
a second compensating data electrode extending from a second drain electrode of the second switching element, wherein the second drain electrode is spaced apart from the second source electrode; and
a second compensating gate electrode diverging from the second gate line, and formed under the second compensating data electrode.

7. The substrate of claim 4, wherein a first gap is disposed between the first and third gate lines and between the first and second data lines, and a second gap is disposed between the second and fourth gate lines and between the first and second data lines.

8. The substrate of claim 1, further comprising:
a first storage electrode extending from the storage line to the first pixel electrode and partially overlapping the first pixel electrode; and
a second storage electrode extending from the storage line to the second pixel electrode and partially overlapping the second pixel electrode.

9. The substrate of claim 1, wherein another storage line is not disposed between the first and third gate lines.

10. A substrate, comprising:
a storage line disposed between first and second gate lines;
a protection. layer disposed over the storage line;
a first pixel electrode adjacent to the first gate line and overlapping the storage line and the protection layer; and
a second pixel electrode adjacent to the second gate line and overlapping the storage line and the protection layer,
wherein a portion of the protection layer disposed over the storage line is exposed between the first and second pixel electrodes to permit contact between a surface of the exposed portion of the protection layer and a surface of a first overlying spacer.

11. The substrate of claim 10, further comprising a third gate line adjacent to the first gate line, wherein a gap is formed between the first and third gate lines, the gap being large enough to accommodate a second overlying spacer.

12. The substrate of claim 11, further comprising a third pixel electrode adjacent to the third gate line, wherein the first to third pixel electrodes are disposed in the same column and the third and second pixel electrodes receive a first polarity data signal during a frame and the first pixel electrode receives a second polarity data signal during the frame.

* * * * *